(12) United States Patent
Qian et al.

(10) Patent No.: US 10,411,917 B2
(45) Date of Patent: Sep. 10, 2019

(54) LINEAR FEEDBACK EQUALIZATION

(71) Applicant: Credo Technology Group Limited, Grand Cayman (KY)

(72) Inventors: Haoli Qian, Fremont, CA (US); Haihui Luo, San Jose, CA (US)

(73) Assignee: Credo Technology Group Limited, Grand Cayman (KY)

(*) Notice: Subject to any disclaimer, the term of this patent is extended or adjusted under 35 U.S.C. 154(b) by 0 days.

(21) Appl. No.: 15/831,092

(22) Filed: Dec. 4, 2017

(65) Prior Publication Data

US 2019/0173695 A1    Jun. 6, 2019

(51) Int. Cl.
| | |
|---|---|
| H03L 7/08 | (2006.01) |
| H04L 25/03 | (2006.01) |
| H04B 1/10 | (2006.01) |

(52) U.S. Cl.
CPC ...... *H04L 25/03019* (2013.01); *H03L 7/0807* (2013.01); *H04B 1/1027* (2013.01)

(58) Field of Classification Search
USPC .................................. 375/230, 233
See application file for complete search history.

(56) References Cited

U.S. PATENT DOCUMENTS

| | | | |
|---|---|---|---|
| 5,392,042 A | 2/1995 | Pellon | |
| 7,301,997 B1 | 11/2007 | Wang et al. | |
| 9,020,065 B2 | 4/2015 | Wyville | |
| 9,461,851 B1* | 10/2016 | Liao | H04L 27/01 |
| 9,667,407 B1 | 5/2017 | Liu et al. | |
| 9,755,600 B1* | 9/2017 | Turker Melek | H03G 1/0029 |
| 9,906,232 B1* | 2/2018 | Cho | H03M 1/002 |
| 2004/0001540 A1 | 1/2004 | Jones | |
| 2006/0044061 A1 | 3/2006 | Mukherjee et al. | |
| 2007/0025224 A1 | 2/2007 | Tatsuzawa et al. | |
| 2007/0030890 A1 | 2/2007 | Yamaguchi | |
| 2007/0285301 A1* | 12/2007 | Nakamoto | H03M 1/0809 341/160 |
| 2008/0260066 A1 | 10/2008 | Cai et al. | |
| 2013/0148712 A1* | 6/2013 | Malipatil | H04L 25/0307 375/233 |
| 2014/0140385 A1* | 5/2014 | Ye | H04L 27/01 375/230 |
| 2015/0236710 A1* | 8/2015 | Bogner | H03M 1/1215 341/122 |
| 2016/0301420 A1* | 10/2016 | Xu | H03M 1/1023 |

(Continued)

OTHER PUBLICATIONS

Agrawal, Ankur, et al.; A 19-Gb/s Serial Link Receiver With Both 4-Tap FFE and 5-Tap DFE Functions in 45-nm SOI CMOS; IEEE J. Solid-State Circuits; Dec. 2012; pp. 3220-3231; vol. 47 No. 12.

(Continued)

*Primary Examiner* — Eva Y Puente
(74) *Attorney, Agent, or Firm* — Ramey & Schwaller LLP; Daniel Krueger

(57) ABSTRACT

A linear feedback equalizer includes comparators that digitize incoming analog signals. The equalizer further includes digital-to-analog converters ("DACs") that transform a current digitized signal into one or more feedback analog signals. The equalizer further includes a subtractor that subtracts the feedback analog signals from the output of a continuous-time linear equalizer ("CTLE") and provides the difference to the comparators as incoming analog signals.

14 Claims, 4 Drawing Sheets

(56) References Cited

U.S. PATENT DOCUMENTS

2017/0019275 A1* 1/2017 Norimatsu .............. H04L 25/03
2018/0234270 A1   8/2018 Kimura et al.

OTHER PUBLICATIONS

Jaussi, J.E., et al.; 8-Gb/s source-synchronous I/O link with adaptive receiver equalization, offset cancellation, and clock de-skew; IEEE J. Solid-State Circuits; Jan. 2005; pp. 80-88; vol. 40 No. 1.

Momtaz, A., et al.; An 80 mW 40 Gb/s 7-tap T/2-spaced feed-forward equalizer in 65 nm CMOS; IEEE J. Solid-State Circuits; Mar. 2010; pp. 629-639; vol. 45 No. 3.

Frian, Edward, et al.; CEI-56G-VSR-PAM4 Very Short Reach Interface; Common Electrical I/O; Jun. 10, 2016; Optical Internetworking Forum.

Non-Final Office Action dated Mar. 9, 2018, in U.S. Appl. No. 15/453,774.

* cited by examiner

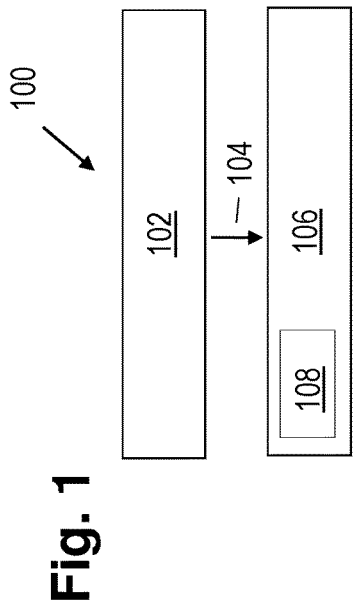
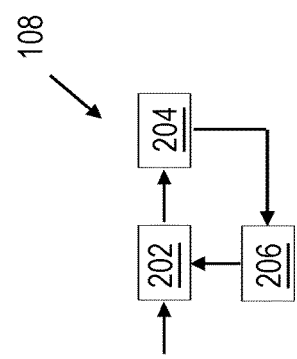

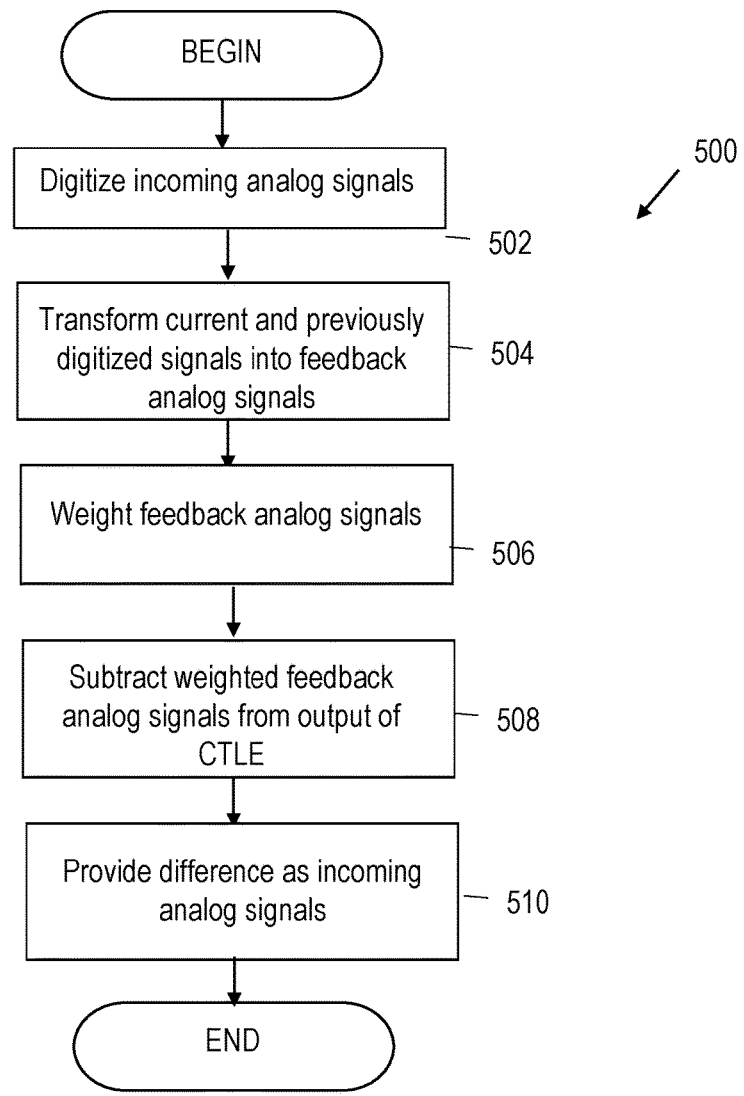

LINEAR FEEDBACK EQUALIZATION

BACKGROUND

Digital communications occur between sending and receiving devices over an intermediate communications medium, or "channel." Each sending device typically transmits symbols at a fixed symbol rate, while each receiving device detects a (potentially corrupted) sequence of symbols and attempts to reconstruct the transmitted data. A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols.

Many digital communication links use only one bit per symbol; a binary '0' is represented by one symbol (e.g., an electrical voltage or current signal within a first range), and binary '1' by another symbol (e.g., an electrical voltage or current signal within a second range), but higher-order signal constellations are known and frequently used. In 4-level pulse amplitude modulation ("PAM4"), each symbol interval may carry any one of four symbols, denoted as −3, −1, +1, and +3. Two binary bits can thus be represented by each symbol.

Channel non-idealities produce dispersion which may cause each symbol to perturb its neighboring symbols, causing inter-symbol interference ("ISI"). ISI can make it difficult for the receiving device to determine which symbols were sent in each interval, particularly when such ISI is combined with additive noise.

SUMMARY

Accordingly, to reduce or eliminate ISI, systems and methods using linear feedback equalization are disclosed herein. A linear feedback equalizer includes comparators that digitize incoming analog signals. The equalizer further includes digital-to-analog converters that transform a current digitized signal and at least one previously digitized signal into feedback analog signals. The equalizer further includes a subtractor that subtracts the feedback analog signals from the output of a continuous-time linear equalizer and provides the difference to the comparators as incoming analog signals.

A method of linear feedback equalization includes digitizing incoming analog signals. The method further includes transforming a current digitized signal and at least one previously digitized signal into feedback analog signals. The method further includes subtracting the feedback analog signals from the output of a continuous-time linear equalizer. The method further includes providing the difference as incoming analog signals.

A serializer/deserializer ("SerDes") linear feedback system includes a SerDes transmitter and receiver. The SerDes receiver includes comparators that digitize incoming analog signals. The receiver further includes digital-to-analog converters that transform a current digitized signal and at least one previously digitized signal into feedback analog signals. The receiver further includes a subtractor that subtracts the feedback analog signals from the output of a continuous-time linear equalizer and provides the difference to the comparators as incoming analog signals.

BRIEF DESCRIPTION OF THE DRAWINGS

In the following detailed description of the various disclosed embodiments, reference will be made to the accompanying drawings in which:

FIG. 1 is a block diagram illustrating a serializer/deserializer ("SerDes") linear feedback system;

FIGS. 2-4 are block diagrams illustrating a linear feedback equalizer; and

FIG. 5 is a flow diagram illustrating a method of linear feedback equalization.

Figure 3:
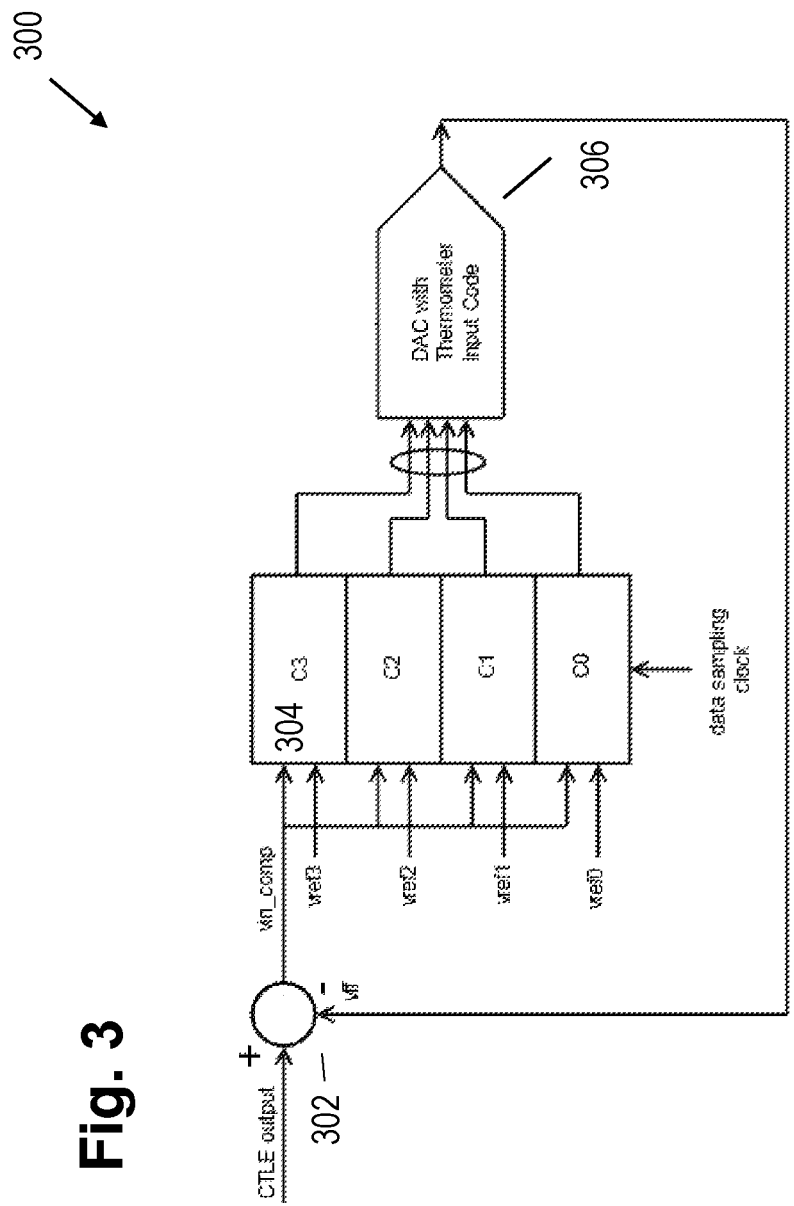

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

NOTATION AND NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

DETAILED DESCRIPTION

To combat noise and intersymbol interference ("ISI"), receiving devices may employ various equalization techniques such as feed forward equalization and decision feedback equalization. Feed forward equalizers ("FFEs") employ a finite impulse response filter with a series of tap weights programmed to adjust impulse response and frequency response. Decision feedback equalizers ("DFEs") reduce ISI without inherently requiring noise amplification by employing a feedback path. However, each of these techniques have drawbacks. Specifically, because FFEs boost high frequency components, crosstalk and other high frequency noises are enhanced along with desired signals resulting in a decreased signal-to-noise ratio. Also, DFEs require that a decision regarding a symbol, i.e. whether the received symbol should be interpreted as a 1 or 0, be made by a comparator within very short time interval such as one unit interval ("UI").

A hybrid system, linear feedback equalization, described herein helps reduce or eliminate these drawbacks and provides better performance, faster speed, and lower cost. FIG. 1 is a block diagram illustrating a serializer/deserializer ("SerDes") linear feedback system 100. The system 100 includes a SerDes transmitter 102, SerDes receiver 106, and a linear feedback equalizer 108. For clarity, the examples used herein will discuss transmitting from the transmitter 102 and receiving at the receiver 106; however, both the transmitter and receiver may be implemented as transceivers, which both transmit and receive. Consequently, both transceivers may include linear feedback equalizers 108. Additionally, such transceivers may be included in a communications network including mobile devices and/or computer systems coupled via a routing network (e.g. the Internet, a wide area network, or a local area network including switches, routers, and the like).

A communication channel 104 extends between the transmitter 102 and receiver 106. The channel 104 may include, for example, transmission media such as fiber optic cables, twisted pair wires, coaxial cables, backplane transmission lines, and wireless communication links. Bidirectional communication between the transmitter 102 and receiver 106 may be provided using separate channels, or in some embodiments, a single channel that transports signals in opposing directions without interference.

The transmitter 102 transmits data to the receiver 106 via a signal on the channel 104. The signal may be, for example, an electrical voltage, an electrical current, an optical power level, a wavelength, a frequency, a phase value, and the like. The receiver 106 receives the signal via the channel 104, and uses the signal to reconstruct the transmitted data. Specifically, the receiver 102 includes a linear feedback equalizer 108, which converts the received signal into a sequence of partial symbol decisions as discussed with respect to the linear feedback equalizers of FIGS. 2-4.

FIG. 2 is a block diagram illustrating a linear feedback equalizer 108, which may be implemented within a SerDes receiver. The equalizer 108 reduces or eliminates ISI entirely, and includes comparators 204, digital-to-analog converters ("DACs") 206, and a subtractor 202. The comparators 204 receive as input analog signals from the subtractor 202, and the comparators 204 digitize the analog signals. For example, the comparators 204 may include analog-to-digital converters ("ADCs"), samplers, and the like. The comparators 204 output digital signals, which the DACs 206 receive as input. Specifically, the comparators 204 output partial symbol decisions based on results of comparison of the analog signals with reference signals as detailed below. Such partial symbol decision need not completely resolve the symbol as necessary in a traditional DFE system; rather, it is only necessary to roughly bracket the incoming signal in one of the several predetermined bins, as performed by a coarse-grained ADC. The granularity of the comparators will affect the extent by which the proposed scheme may cancel ISI, but unlike a traditional DFE, the full resolution of the symbol is not required to offer performance benefit.

The DACs 206 transform a current digitized signal and at least one previously digitized signal, in the case of a multi-tap configuration (described with respect to FIG. 4), into feedback analog signals which may be weighted by the DACs 206. Specifically, the comparators 204 or DACs 206 may include a memory or storage element that delays or stores an output of the comparators 204 from the previous clock cycle for use in the input or output of the DACs 206 in the current clock cycle. The DACs 206 output feedback analog signals, which the subtractor 202 receives as input. In addition, the subtractor 202 may receive as input the output of a continuous-time linear equalizer ("CTLE"), which processes the signal received by the SerDes receiver. The CTLE is a linear filter that attenuates low-frequency signal components, amplifies components around the Nyquist frequency, and filters higher frequencies. The CTLE gain may be adjusted to optimize the ratio of low frequency attenuation to high frequency amplification. The subtractor 202 subtracts the feedback analog signals from the received signal or the output of the CTLE in various embodiments. The subtractor 202 provides the difference to the comparators 204 as incoming analog signals. FIG. 3 illustrates another embodiment of a linear feedback equalizer.

FIG. 3 is a block diagram illustrating a linear feedback equalizer 300, which may be implemented within a SerDes receiver, including a subtractor 302, comparators 304, and a DAC 306. Here, the comparators 304 include 4 comparing elements, C0, C1, C2, and C3, each of which compare a signal or portion of a signal, vin_comp, with a reference such as a reference voltage, Vref0, Vref1, Vref2, and Vref3. The references may or may not be evenly spaced, e.g., the voltage difference between successive references may or may not be the same. If a supplied signal is above the reference for a particular comparator 304, then the comparator 304 outputs a first binary signal such as a 1 or high signal. If the supplied signal is below the reference for a particular comparator, then the comparator 304 outputs a second binary signal such as a 0 or low signal. In this way, the analog signals provided by the subtractor 302 are digitized.

Each clock cycle, the comparators 304 provide the DAC 306 with a 4-bit unary code, sometimes called a thermometer code, representing the amplitude of the received signal. Such code is not necessarily equivalent to the final symbol resolution. Specifically, a code of 1111 represents a greater amplitude than a code of 1110, which itself is greater than 1100, and so on. The DAC 306 converts the thermometer code into an analog signal, vff, and in at least one embodiment, assigns weights to each portion of the thermometer code during conversion. The weights are assigned such that ISI is minimized. Specifically, if a channel's ISI is large, the weight assigned is relatively larger. Similarly, if a channel's ISI is small, the weight assigned is relatively smaller. Additionally, the assigned weight may be relatively larger or smaller depending upon the type of ISI present in the channel, the cause of the ISI, or the reference levels used by the comparators 304. By assigning different weights, the reference voltages, Vref0, Vref1, Vref2, and Vref3, need not be evenly spaced.

Figure 4:
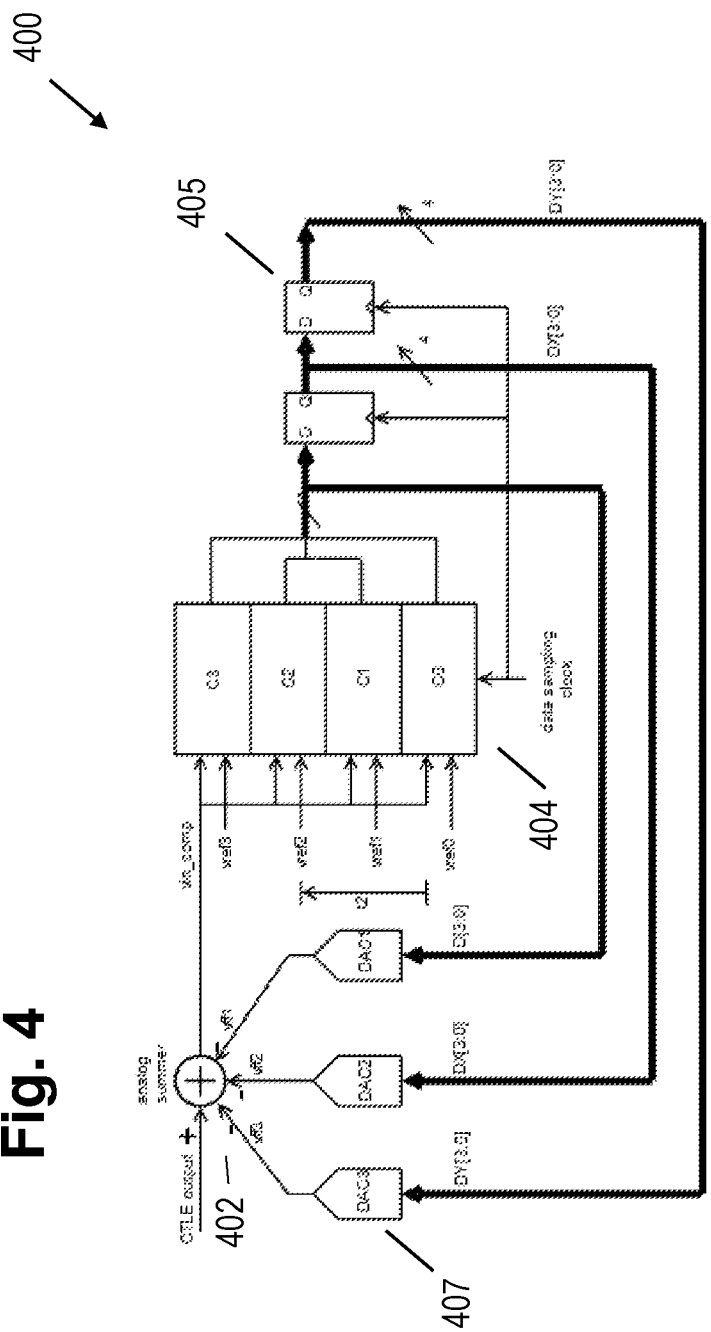

The DAC 306 outputs the analog signal, and the subtractor 302 receives the analog signal as input. The subtractor 302 subtracts the analog signal from a CTLE output signal to produce the comparator input signal, vin_comp, with no ISI or reduced ISI. The subtractor 302 may be implemented using multiple differential current outputs, switched capacitor subtractors, and the like. The configuration of the comparators 304, DAC 306, and analog summer 302 shown would produce 1 UI delay. As a result, it implements linear feedback equalization with one tap, i.e., the feedback used is from the immediately preceding clock cycle. FIG. 4 illustrates an embodiment of a three-tap configuration.

FIG. 4 is a block diagram illustrating a linear feedback equalizer 400, which may be implemented within a SerDes receiver in a linear feedback equalization system. The linear feedback equalizer includes comparators 404, flip-flop banks 405, DACs 407, and a subtractor 402. The comparators 404 operate similarly to the comparators 304 described with respect to FIG. 3. Here, flip-flop banks 405 provide multiple previously digitized signals to multiple DACs 407 by forming a shift-register, which delays the comparator output signals. Specifically, the comparators 404 output to DAC1 407 and a first flip-flop bank 405. The first flip-flop bank 405 outputs to DAC2 407 and a second flip-flop bank 405. The second flip-flop bank 405 outputs to DAC3 407. In this way, the current digitized signal (most recently output by the comparators 404) and each of the two previously digitized signals drive a separate DAC 407.

DAC1, DAC2, and DAC3 respectively produce analog output signals vff1, vff2, and vff3. These signals are then subtracted from CTLE output signal by the subtractor 402 to produce the comparator input signal, vin_comp, with no ISI or reduced ISI. The subtractor 402 may be implemented using multiple differential current outputs, switched capacitor subtractors, and the like.

FIG. 5 is a flow diagram illustrating a method 500 of linear feedback equalization. At 502, a linear feedback equalizer digitizes incoming analog signals. For example, the equalizer may compare the signals with references, e.g. reference voltages, and assign a bit value to the signals based on the comparison. If the signal is above the reference, a first bit value may be assigned. If the signal is below the reference a second bit value may be assigned. The bit values are digital representations of the analog signals.

At 504, the equalizer transforms a current digitized signal and at least one previously digitized signal, in a multi-tap embodiment, into feedback analog signals. The previously digitized signals may be stored or delayed in order to provide them during the current clock cycle. Additionally, the current digitized signal may be delayed for use in subsequent clock cycles for use as a previously digitized signal. For example, a flip-flop bank may be used to provide the previously digitized signal. In at least one embodiment, the equalizer may input the current digitized signal and each of the previously digitized signal into a separate DAC.

At 506, the equalizer weights the feedback analog signals. The weights are assigned such that ISI is minimized. Specifically, if a channel's ISI is large, the weight assigned is relatively larger. Similarly, if a channel's ISI is small, the weight assigned is relatively smaller. Additionally, the assigned weight may be relatively larger or smaller depending upon the type of ISI present in the channel, the cause of the ISI, or the reference levels used by the comparators. By assigning different weights, the reference voltages need not be evenly spaced.

At 508, the equalizer subtracts the feedback analog signals from the output of a continuous-time linear equalizer ("CTLE") or from the received signal directly. For example, the equalizer may input a feedback analog signal from each DAC into a subtractor along with the output of the CTLE. Accordingly, ISI is reduced or eliminated. At 510, the equalizer provides the difference as incoming analog signals. For example, the equalizer may provide the difference to comparators that digitize the incoming analog signals.

Linear feedback equalization does not achieve ISI reduction or cancellation in the digital domain. Rather, ISI reduction or cancellation is achieved in the analog domain. As such, system complexity is reduced as well as power consumption. Unlike using DFE techniques, linear feedback equalization does not rely on a final decision with regards to symbol decisions, which requires aggressive decision timing. Rather, partial symbol decisions are used. As such, system complexity is further reduced as well as power consumption. In some aspects, systems, methods, and apparatuses for linear feedback equalization are provided according to one or more of the following examples.

Example 1

A linear feedback equalizer includes comparators that digitize incoming analog signals. The equalizer further includes digital-to-analog converters that transform a current digitized signal into one or more feedback analog signals. The equalizer further includes a subtractor that subtracts the feedback analog signals from the output of a continuous-time linear equalizer and provides the difference to the comparators as incoming analog signals.

Example 2

A method of linear feedback equalization includes digitizing incoming analog signals. The method further includes transforming a current digitized signal into one or more feedback analog signals. The method further includes subtracting the feedback analog signals from the output of a continuous-time linear equalizer. The method further includes providing the difference as incoming analog signals.

Example 3

A serializer/deserializer ("SerDes") linear feedback system includes a SerDes transmitter and receiver. The SerDes receiver includes comparators that digitize incoming analog signals. The receiver further includes digital-to-analog converters that transform a current digitized signal into one or more feedback analog signals. The receiver further includes a subtractor that subtracts the feedback analog signals from the output of a continuous-time linear equalizer and provides the difference to the comparators as incoming analog signals.

The following features may be incorporated into the various embodiments described above, such features incorporated either individually in or conjunction with one or more of the other features. The equalizer may be implemented within a SerDes receiver. The method may further include delaying the current digitized signal, and repeating said transforming using the delayed digitized signal as the at least one previously digitized signal. The method may further include weighting the feedback analog signals. Subtracting the feedback analog signals may reduce or eliminate inter-symbol interference. Digitizing incoming analog signals may include comparing the signals with reference voltages and assigning a bit value to the signals based on the comparison. Transforming the current digitized signal and at least one previously digitized signal may include inputting the current digitized signal and each of the at least one previously digitized signal into a separate DAC. Subtracting the feedback analog signals may include inputting a feedback analog signal from each DAC into a subtractor. The current digitized signal and each of the at least one previously digitized signal may drive a separate DAC. The weight of the least significant bit for a DAC may act as a tap weight. At least one previously digitized signal may be provided by a flip-flop bank. The equalizer may reduce or eliminate inter-symbol interference.

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:
1. A linear feedback equalizer comprising:
  comparators that digitize an incoming analog signal to provide a multi-bit thermometer-coded digital signal using unevenly-spaced reference voltages to generate the bits of the multi-bit thermometer-coded digital signal;

one or more digital-to-analog converters ("DACs") that transform the thermometer-coded digital signal into one or more feedback analog signals each having a corresponding tap delay; and a subtractor that subtracts the one or more feedback analog signals from an output of a continuous-time linear equalizer ("CTLE") and provides the difference to the comparators as said incoming analog signals.

2. The linear feedback equalizer of claim 1, wherein the comparators slice the incoming analog signal into a number of bins that is one greater than a number of bits used by the multi-bit thermometer-coded digital signal, and wherein the number of bins is also greater than a number of symbols in a signal constellation used by the incoming analog signal.

3. The linear feedback equalizer of claim 2, wherein the number of symbols in the signal constellation is two and the number of bins is five.

4. The linear feedback equalizer of claim 2, wherein the number of symbols in the signal constellation is four and the number of bins is five.

5. The linear feedback equalizer of claim 1, wherein a transmitted data stream is reconstructed from the multi-bit thermometer-coded digital signal.

6. The linear feedback equalizer of claim 1, wherein at least one of the one or more DACs weights the bits of the multi-bit thermometer coded digital signal unevenly when transforming the digital signal into a feedback analog signal.

7. A linear feedback equalization method that comprises:

comparing an incoming analog signal to multiple thresholds to obtain a multi-bit thermometer-coded digital signal, the multiple thresholds being unevenly spaced;

transforming the multi-bit thermometer-coded digital signal into one or more feedback analog signals each having a corresponding tap delay;

filtering a receive signal with a continuous time linear equalizer ("CTLE") to obtain a filtered analog signal; and combining the one or more feedback analog signals with the filtered analog signal to provide said incoming analog signal, said incoming analog signal having reduced intersymbol interference relative to the filtered analog signal.

8. The method of claim 7, wherein said receive signal carries a transmitted data stream encoded with a constellation having a given number of symbols, and wherein said comparing digitizes the incoming analog signal into one of a number of bins that is greater than said given number of symbols.

9. The method of claim 8, wherein the given number of symbols in the signal constellation is two and the number of bins is five.

10. The method of claim 8, wherein the given number of symbols in the signal constellation is four and the number of bins is five.

11. The method of claim 8, further comprising: reconstructing the transmitted data stream from the multi-bit thermometer-coded digital signal.

12. The method of claim 7, wherein said transforming includes weighting the bits of the multi-bit thermometer coded digital signal unevenly when transforming the digital signal into a feedback analog signal.

13. An integrated circuit having a serializer/deserializer interface with a receiver that comprises a linear feedback equalizer, the linear feedback equalizer including:

comparators that compare an incoming analog signal to multiple thresholds to obtain a multi-bit thermometer-coded digital signal, the multiple thresholds being unevenly spaced;

one or more digital-to-analog converters ("DACs") that transform the multi-bit thermometer-coded digital signal into one or more feedback analog signals each having a corresponding tap delay;

a continuous time linear equalizer ("CTLE") that filters a receive signal to obtain a filtered analog signal; and a combiner that subtracts the one or more feedback analog signals from the filtered analog signal to provide said incoming analog signal, said incoming analog signal having reduced intersymbol interference relative to the filtered analog signal.

14. The integrated circuit of claim 13, wherein said receive signal carries a transmitted data stream encoded with a constellation having a given number of symbols, and wherein said comparators digitize the incoming analog signal into a number of discrete values that is greater than said given number of symbols.

* * * * *